US006953730B2

(12) United States Patent
Ahn et al.

(10) Patent No.: US 6,953,730 B2
(45) Date of Patent: Oct. 11, 2005

(54) LOW-TEMPERATURE GROWN HIGH QUALITY ULTRA-THIN COTIO3 GATE DIELECTRICS (75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 10/028,643

(22) Filed: Dec. 20, 2001

(65) Prior Publication Data

US 2003/0119246 A1 Jun. 26, 2003

(51) Int. Cl.$^7$ ............................................. H01L 21/336
(52) U.S. Cl. ....................... 438/287; 438/240; 438/591; 438/768
(58) Field of Search ............................. 438/240, 287.5, 438/91, 768

(56) References Cited

U.S. PATENT DOCUMENTS

| 3,381,114 A | 4/1968 | Nakanuma ................ 219/385 |
| 4,215,156 A | 7/1980 | Dalal et al. ................... 427/84 |
| 4,333,808 A | 6/1982 | Bhattacharyya et al. 204/192 D |

(Continued)

FOREIGN PATENT DOCUMENTS

| JP | 62-199019 | 9/1987 |
| JP | 5090169 | 4/1993 |
| JP | 2001332546 A | * 11/2002 |

OTHER PUBLICATIONS

Aarik, Jaan.,et al. ,"Texture development in nanocrystalline hafnium dioxide thin films grown by atomic layer deposition", *Journal of Crystal Growth*, (2000),pp.105–113.

Bright, A.A. ,et al. ,"Low–rate plasma oxidation of Si in a dilute oxygen/helium plasma for low–temperature gate quality Si/Sio2 interfaces", *Applied Physics Letters*, (Feb. 1991), pp. 619–621.

Cheng, Baohong.,et al. ,"The Impact of High–k Gate Dielectrics and Metal Gate Electrodes on Sub–100nm MOSFET's", *IEEE Transactions on Electron Devices*, (1999), 1537–1544.

Desu, S.B..,"Minimization of Fatigue in Ferroelectric Films", *Phys. Stat. Sol. (a) 151*, (1995),467–480.

Engelhardt, M..,"Modern Applications of Plasma Etching and Patterning in Silicon Process Technology", *Contrib. Plasma. Phys., 39(5)*, (1999),pp. 473–478.

Fuyuki, Takashi.,"Electronic Properties of the Interface between Si and TiO2 Deposited at Very Low Temperatures", *Journal of Applied Physics*, (1986),pp. 1288–1291.

Fuyuki, Takashi.,et al. ,"Initial stage of ultra–thin SiO2 formation at low temperatures using activated oxygen", *Applied Surface Science*, (1997),pp. 123–126.

(Continued)

*Primary Examiner*—Long Pham
(74) *Attorney, Agent, or Firm*—Schwegman, Lundberg, Woessner & Kluth, P.A.

(57) ABSTRACT

A gate oxide and method of fabricating a gate oxide that produces a more reliable and thinner equivalent oxide thickness than conventional $SiO_2$ gate oxides are provided. Gate oxides formed from alloys such as cobalt-titanium are thermodynamically stable such that the gate oxides formed will have minimal reactions with a silicon substrate or other structures during any later high temperature processing stages. The process shown is performed at lower temperatures than the prior art, which inhibits unwanted species migration and unwanted reactions with the silicon substrate or other structures. Using a thermal evaporation technique to deposit the layer to be oxidized, the underlying substrate surface smoothness is preserved, thus providing improved and more consistent electrical properties in the resulting gate oxide.

26 Claims, 6 Drawing Sheets

U.S. PATENT DOCUMENTS

| | | | |
|---|---|---|---|
| 4,394,673 A | 7/1983 | Thompson et al. | 357/15 |
| 4,399,424 A * | 8/1983 | Rigby | |
| 4,413,022 A | 11/1983 | Suntola et al. | 427/255.2 |
| 4,590,042 A | 5/1986 | Drage | 422/186.06 |
| 4,647,947 A | 3/1987 | Takeoka et al. | 346/135.1 |
| 4,767,641 A | 8/1988 | Kieser et al. | 427/38 |
| 4,920,071 A | 4/1990 | Thomas | 437/188 |
| 4,993,358 A | 2/1991 | Mahawili | 118/715 |
| 5,006,192 A | 4/1991 | Deguchi | 156/345 |
| 5,055,319 A | 10/1991 | Bunshah et al. | 427/38 |
| 5,080,928 A | 1/1992 | Klinedinst et al. | 427/70 |
| 5,198,029 A | 3/1993 | Dutta et al. | 118/303 |
| 5,595,606 A | 1/1997 | Fujikawa et al. | 118/725 |
| 5,621,681 A | 4/1997 | Moon | 365/145 |
| 5,698,022 A | 12/1997 | Glassman et al. | |
| 5,735,960 A | 4/1998 | Sandhu et al. | 118/723 IR |
| 5,744,374 A | 4/1998 | Moon | 437/60 |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,828,080 A * | 10/1998 | Yano et al. | |
| 5,840,897 A | 11/1998 | Kirlin et al. | 546/2 |
| 5,916,365 A | 6/1999 | Sherman | 117/92 |
| 5,950,925 A | 9/1999 | Fukunaga et al. | 239/132.3 |
| 5,972,847 A | 10/1999 | Feenstra et al. | 505/473 |
| 6,013,553 A | 1/2000 | Wallace et al. | 438/287 |
| 6,020,024 A | 2/2000 | Maiti et al. | 427/248.1 |
| 6,027,961 A | 2/2000 | Maiti et al. | 438/199 |
| 6,057,271 A | 5/2000 | Kenjiro et al. | 505/475 |
| 6,059,885 A | 5/2000 | Ohashi et al. | 118/730 |
| 6,093,944 A | 7/2000 | VanDover | 257/310 |
| 6,110,529 A | 8/2000 | Gardiner et al. | 427/250 |
| 6,161,500 A | 12/2000 | Kopacz et al. | 118/723 E |
| 6,171,900 B1 | 1/2001 | Sun | 438/240 |
| 6,203,613 B1 | 3/2001 | Gates et al. | 117/104 |
| 6,206,972 B1 | 3/2001 | Dunham | 118/715 |
| 6,207,589 B1 | 3/2001 | Ma et al. | 438/785 |
| 6,211,035 B1 | 4/2001 | Moise et al. | 438/396 |
| 6,225,168 B1 | 5/2001 | Gardner et al. | 438/287 |
| 6,232,847 B1 | 5/2001 | Marcy, 5th et al. | 331/167 |
| 6,281,144 B1 | 8/2001 | Cleary et al. | 438/780 |
| 6,291,866 B1 | 9/2001 | Wallace et al. | 257/410 |
| 6,297,516 B1 | 10/2001 | Forrest et al. | 257/40 |
| 6,297,539 B1 | 10/2001 | Ma et al. | 257/410 |
| 6,302,964 B1 | 10/2001 | Umotoy et al. | 118/715 |
| 6,303,481 B2 | 10/2001 | Park | 438/591 |
| 6,348,386 B1 | 2/2002 | Gilmer | 438/288 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,420,279 B1 | 7/2002 | Ono et al. | 438/785 |
| 6,432,779 B1 | 8/2002 | Hobbs et al. | 438/287 |
| 6,444,039 B1 | 9/2002 | Nguyen | 118/715 |
| 6,444,895 B1 | 9/2002 | Nikawa | 136/212 |
| 6,445,023 B1 | 9/2002 | Vaartstra et al. | 257/295 |
| 6,448,192 B1 | 9/2002 | Kaushik | 438/785 |
| 6,451,695 B2 | 9/2002 | Sneh | 438/685 |
| 6,458,701 B1 | 10/2002 | Chae et al. | 438/680 |
| 6,465,334 B1 | 10/2002 | Buynoski et al. | 438/591 |
| 6,482,740 B2 | 11/2002 | Soininen et al. | 438/686 |
| 6,495,436 B2 | 12/2002 | Ahn et al. | 438/591 |
| 6,514,828 B2 | 2/2003 | Ahn et al. | 438/297 |
| 6,521,911 B2 | 2/2003 | Parsons et al. | 257/52 |
| 6,531,354 B2 | 3/2003 | Maria et al. | 438/216 |
| 6,534,420 B2 | 3/2003 | Ahn et al. | 438/768 |
| 6,602,338 B2 | 8/2003 | Chen et al. | 106/287.19 |
| 6,608,378 B2 | 8/2003 | Forbes et al. | 257/701 |
| 6,661,058 B2 | 12/2003 | Ahn et al. | 257/344 |
| 2001/0002280 A1 | 5/2001 | Ofer | 427/255.28 |
| 2001/0009695 A1 | 7/2001 | Ville A et al. | 427/255.39 |
| 2001/0051442 A1 | 12/2001 | Dina et al. | 438/758 |
| 2001/0053082 A1 | 12/2001 | Makarand et al. | 362/496 |
| 2002/0001971 A1 | 1/2002 | Hag-ju | 438/765 |
| 2002/0022156 A1 | 2/2002 | Clark | 428/765 |
| 2002/0089023 A1 | 7/2002 | Yu et al. | 257/411 |
| 2002/0111001 A1 | 8/2002 | Ahn et al. | 438/592 |
| 2002/0119297 A1 | 8/2002 | Forrest et al. | 428/199 |
| 2002/0146916 A1 | 10/2002 | Kiyoshi et al. | 438/785 |
| 2002/0155688 A1 * | 10/2002 | Ahn et al. | |
| 2002/0155689 A1 * | 10/2002 | Ahn et al. | |
| 2002/0192974 A1 | 12/2002 | Ahn et al. | 438/722 |
| 2003/0001241 A1 | 1/2003 | Chakrabarti et al. | 257/643 |
| 2003/0003702 A1 | 1/2003 | Ahn et al. | 438/591 |
| 2003/0017717 A1 | 1/2003 | Ahn et al. | 438/768 |
| 2003/0157764 A1 | 8/2003 | Ahn et al. | 438/212 |
| 2003/0175411 A1 | 9/2003 | Kodas et al. | 427/58 |
| 2003/0228747 A1 | 12/2003 | Ahn et al. | 438/591 |
| 2004/0033681 A1 | 2/2004 | Ahn et al. | 438/591 |
| 2004/0033701 A1 | 2/2004 | Ahn et al. | 438/785 |
| 2004/0065255 A1 | 4/2004 | Yang et al. | 118/715 |

OTHER PUBLICATIONS

Gartner, M.,"Spectroellipsometric characterization of lanthanide–doped TiO2 films obtained via the sol–gel technique", *Thin Solid Films*, (1993),pp.561–565.

Hirayama, Masaki.,et al. ,"Low–Temperature Growth of High–Integrity Silicon Oxide Films by Oxygen Radical Generated in High Density Krypton Plasma", *IEDM Technical Digest*, (1999),249–252.

Hubbard, K..J. ,et al. ,"Thermodynamic stability of binary oxides in contact with silicon", *J. Mater. Res.*, (Nov. 1996), 2757–2776.

Hunt, C..E. ,et al. ,"Direct bonding of micromachined silicon wafers for laser diode heat exchanger applications", *J. Micromech. Microeng.*, *1*, (1991),pp. 152–156.

Jeong, Chang–Wook.,et al. ,"Plasma–Assisted Atomic Layer Growth of High–Quality Aluminum Oxide Thin Films", *Japanese Journal of Applied Physics*, (Jan. 2001),pp. 285–289.

Kawai, Y.,et al. ,"Ultra–low temperature growth of high–integrity gate oxide films by low–energy ion–assisted oxidation", *Applied Physics Letters*, (Apr. 1994),pp. 2223–2225.

Keomany, D.,"Sol gel preparation of mixedcerium–titanium oxide thin films", *Solar Energy Materials and Solar Cells*, (1994),pp. 429–441.

Kim, C.T. ,et al. ,"Application of Al2O3 Grown by Atomic Layer Deposition to DRAM and FeRAM", *International Symposium in Integrated Ferroelectrics*, (Mar. 2000),p. 316.

Kim, D..,et al. ,"Atomic Control of Substrate Termination and Heteroepitaxial Growth of SrTiO3/LaAlO3 Films", *Journal of the Korean Physical Society* vol. 36 No. 6, (Jun. 2000),444–448.

Kim, Y.,et al. ,"Substrate dependence on the optical properties of Al2O3 films grown by atomic layer deposition", *Applied Physics Letters*, (Dec. 1997),pp. 3604–3606.

Krauter, G..,et al. ,"Room Temperature Silicon Wafer Bonding with Ultra–Thin Polymer Films", *Advanced Materials*, *9(5)*, (1997),pp. 417–420.

Kukli, Kaupo.,et al. ,"Atomic Layer Deposition of Titanium Oxide from TiI4 and H2O2", *Chemical Vapor Deposition*, (2000),pp. 303–310.

Kukli, K.,et al. ,"Controlled Growth of Yttrium Oxysulphide Thin Films by Atomic Layer Deposition", *Materials Science Forum*, (1999),pp. 216–221.

Lee, Cheng–Chung., "Ion–assisted deposition of silver thin films", *Thin Solid Films*, (2000),pp. 95–97.

Lee, Dong.H. ,"Metalorganic chemical vapor deposition of Tio2:n anatase thin film on Si substrate", *Applied Physics Letters*, (Feb. 1995),pp. 815–816.

Leskela, M.,et al. ,"ALD precursor chemistry: Evolution and future challenges", *Journal de Physique*, (1999),pp. 837–852.

Liu, C..T. , "Circuit Requirement and Integration Challenges of Thin Gate Dielectrics for Ultra Small MOSFET's", *IEDM*, (1998),747–750.

Liu, Y.C. ,et al. ,"Growth of ultrathin SiO2 by surface irradiation with an O2+Ar election cyclotron resonance microwave plasma at low temperatures", *Journal of Applied Physics*, (Feb. 1999),pp. 1911–1915.

Lucovsky, G.,et al. ,"Microscopic model for enhanced dielectric constants in low concentration SiO2–rich noncrystalline Zr and Hf silicate alloys", *Applied Physics Letters*, (Oct. 2000),pp. 2912–2914.

Martin, P.J. ,et al. ,"Ion–beam–assisted deposition of thin films", *Applied Optics*, (Jan. 1983),pp. 178–184.

Molsa, Heini.,et al. ,"Growth of Yttrium Oxide Thin Films from B–Diketonate Precursor", *Advanced Materials for Optics and Electronics*, (1994),pp. 389–400.

Muller, D..A. ,"The electronic structure at the atomic scale of ultrathin gate oxides", *Nature*, vol. 399, No. 6738, Jun. 24, 1999, (1999),758–61.

Nakajima, Anri.,et al. ,"NH3–annealed atomic–layer–deposited silicon nitride as a high–k gate dielectric with high reliability", *Applied Physics Letters*, (Feb. 2002),pp. 1252–1254.

Neumayer, D.A. ,et al. ,"Materials characterization of ZrO2–SiO2 and HfO2–SiO2 binary oxides deposited by chemical solution deposition", *Journal of Applied Physics*, (Aug. 2001),pp. 1801–1808.

Nieminen, Minna.,et al. ,"Formation and stability of lanthanum oxide thin films deposited from B–diketonate precursor", *Applied Surface Science*, (2001),pp. 155–165.

Ohring, Milton.,"The Materials Science of Thin Films", *Academic Press Inc.*, (1992),118,121,125.

Osten, H..J. ,et al. ,"High–k Gate Dielectrics with Ultra–low Leakage Current Based on Praseodymium Oxide", *IEEE*, (2000),653–656.

Pan, Tung.M. ,et al. ,"High Quality Ultrathin CoTiO3 High–k Gate Dielectrics", *Electrochemical and Solid–State Letters*, (2000),pp. 433–434.

Pan, Tung.M. ,et al. ,"High–k cobalt–titanium oxide dielectrics formed by oxidation of sputtered Co/Ti or Ti/Co films", *Applied Physcis Letters*, (Mar. 2001),pp. 1439–1441.

Qi, Wen–Jie.,et al. ,"MOSCAP and MOSFET characteristics using Zr02 gate dielectric deposited directly on Si", *IEDM Technical Digest*, (1999),145–148.

Rayner Jr., G.,et al. ,"The Structure of Plasma–Deposited and Annealed Pseudo–Binary ZrO2–SiO2 Alloys", *Material Res. Soc. Symp.*, (2000),pp. C1.3.1–C1.3.9.

Ritala, Mikko.,"Atomic Layer Epitaxy Growth of Titanium, Zirconium and Hafnium Dioxide Thin Films", *Annales Academiae Scientiarum Fennicae*, (1994),pp. 24–25.

Rotondaro, A.L. ,et al. ,"Advanced CMOS Transistors with a Novel HfSiON Gate Dielectric", *Symposium on VLSI Technology Digest of Technical Papers*, (2002),pp. 148–149.

Saito, Yuji.,et al. ,"Advantage of Radical Oxidation for Improving Reliability of Ultra–Thin Gate Oxide", *2000 Symposium on VLSI Technology Digest of Technical Papers*, (2000),176–177.

Saito, Yuji.,et al. ,"High–Integrity Silicon Oxide Grown at Low–Temperature by Atomic Oxygen Generated in High–Density Krypton Plasma", *Extended Abstracts of the 1999 International Conference on Solid State Devices and Materials*, (1999),152–153.

Shanware, A.,et al. ,"Reliability evaluation of HfSiON gate dielectric film with 12.8 A SiO2 equivalent thickness", *International Electron Devices Meeting*, (2001),pp. 137–140.

Shin, Chang.H. ,et al. ,"Fabriation and Characterization of MFISFET using Al2O3 Insulating Layer for Non–Volatile Memory", *12th International Symposium in Integrated Ferroelectrics*, (Mar. 2000),1–9.

Sneh, Ofer.,et al. ,"Thin film atomic layer deposition equipment for semiconductor processing", *Thin Solid Films*, (2002),pp. 248–261.

Song, Hyun–Jung.,et al. ,"Atomic Layer Deposition of Ta2O5 Films Using Ta(OC2H5)5 and NH3", *Mat. Res. Soc. Symp. Proc.*, (1999),pp. 469–471.

Suntola, T..,"Atomic Layer Epitaxy", *Handbook of Crystal Growth, 3; Thin Films of Epitaxy, Part B: Growth Mechanics and Dynamics*, Amsterdam,(1994),pp. 601–663.

Suntola, T..,"Atomic layer epitaxy", *Thin Solid Films, 216*, (1992),pp. 84–89.

Sze, S.M. , *Physics of Semiconductor Devices*, (1981),p. 431, 473.

Van Dover, R.B. ,"Amorphous lanthanide–doped TiOx dielectric films", *Applied Physics Letters*, (May 1999),pp. 3041–3043.

Viirola, H.,et al. ,"Controlled growth of antimony–doped tin dioxide thin films by atomic layer epitaxy", *Thin Solid Films*, (1994),pp. 127–135.

Viirola, H.,et al. ,"Controlled growth of tin oxide thin films by atomic layer epitaxy", *Thin Solid Films*, (1994),pp. 144–149.

Visokay, M.R. ,et al. ,"Application of HfSiON as a gate dielectric material", *Applied Physics Letters*, (Apr. 2002),pp. 3183–3185.

Wilk, G.D. ,et al. ,"Hafnium and zirconium silicates for advanced gate dielectrics", *Journal of Applied Physics*, (Jan. 2000),pp. 484–492.

Zucker, O..,et al. ,"Application of Oxygen Plasma Processing to Silicon Direct Bonding", *Sensors and Actuators A, 36*, (1993),pp. 227–231.

Aarik, Jaan , et al., "Atomic layer growth of epitaxial TiO2 thin films from TiCl4 and H2O on Al2O3 substrates", *Journal of Crystal Growth*, (2002),pp. 189–198.

Aarik, Jaan , et al., "Phase transformations in hafnium dioxide thin films grown by atomic layer doposition at high temperatures", *Applied Surface Science*, 173,(2001),pp. 15–21.

Aarik, Jaan , et al., "Texture Development in nanocrystalline hafnium dioxide thin films grown by atomic layer deposition", *Journal of Crystal Growth*, 220,(2000),pp. 105–113.

Ahn, Kie Y., et al., "Highly Reliable Amorphous High–K Gate Oxide ZrO2", *Micron Docket No. 01–0516*, (May 17, 2001),3 pages.

Bunshah, Rointan F., et al., "Deposition Technologies for Films and Coatings", Developments and Applications,pp. 102–103.

Cava, R J., et al., "Improvement of the dielectric properties of Ta2O5 through substitution with Al2O3", *Applied Physics Letters*, (Mar. 17, 1997),pp. 13981396–.

Copel, M. , et al., "Structure and stability of ultrathin zirconium oxide layers on Si(001)", *Applied Physics Letters*, Vol 76, No. 4,(Jan. 24, 2000),pp. 436–438.

De Flaviis, Franco , et al., "Planar Micorwave Integrated Phase–Shifter Design with High Purity Ferroelectric Material", *IEEE Transactions on Microwave Theory Techniques*, vol. 45, No. 6,(Jun. 1997),pp. 963–969.

Forsgren, Katarina , et al., "Atomic Layer Deposition of HfO2 using hafnium iodide", *Conference held in Monterey, California*, (May, 2001), 1 page.

Fuyuki, Takashi , et al., "Electronic Properties of the Interface between Si and TiO2 Deposited at Very Low Temperatures", *Jpn. J. Appl. Phys.*, vol. 25, No. 9,(1986), pp. 1288–1291.

Garter, M. , et al., "Spectroellipsometric characterization of lanthanide–doped TiO2 films obtained via the sol–gel technique", *Thin Solid Films*, 234,(1993),pp. 561–565.

Geller, S. , et al., "Crystallographic Studies of Perovskite–like Compounds. II. Rare Earth Aluminates", *Acta Cryst.* vol. 9, (May 29, 1956),pp. 1019–1025.

Giess, E. A., et al., "Lanthanide gallate perovskite–type substrates for epitaxial, high–Tc superconducting Ba2YCu3O7– films", *IBM J. Res. Develop.* vol. 34, No. 6, (Nov. 6, 1990),pp. 916–926.

Gusev, E P., et al., "Ultrathin High–K Dielectrics Grown by Atomic Layer Deposition: A Comparative Study of ZrO2, HfO2, Y2O3 and Al2O3", *Electrochemical Society Proceedings* vol. 2001–9, (2001),pp. 189–195.

Iddles, D. M., et al., "Relationships between dopants, microstructure and the microwave dielectric properties of ZrO2–TiO2–SnO2 ceramics", *Journal of Materials Science*, vol. 27,(1992),pp. 6303–6310.

Jeon, Sanghun , et al., "Excellent Electrical Characteristics of Lanthanide (Pr, Nd, Sm, Gd, and Dy) Oxide and Lanthanide–doped Oxide for MOS Gate Dielectric Applications", *Technical Digest of IEDM*, (2001),pp. 471–474.

Jeong, Chang–Wook, et al., "Plasma–Assisted Atomic layer Growth of High–Quality Aluminum Oxide Thin Films", *Jpn. J. Appl. Phys.*, vol. 40,(Jan. 2001),pp. 285–289.

Keomany, D. , et al., "Sol gel preparation of mixed cerium–titanium oxide thin films", *Sol. Energy Mater. So. Cells*, 33,(1994),pp. 429–441.

Kim, C. T., et al., "Application of Al3O3 Grown by Atomic Layer Deposition to DRAM and FeRAM", *12th International Symposium in Integrated Ferroelectrics*, (Mar., 2000),1 page.

Kim, Byoung–Youp , et al., "Comparison Study for TiN Films Deposited from Different Method: Chemical Vapor Deposition and Atomic Layer Deposition", *Mat. Res. Soc., Symp. Proc.*, vol. 672,(2001),pp. 7.8.1–7.8.6.

Kim, Taeseok , et al., "Correlation between strain and dielectric properties in ZrTiO4 thin films", *Applied Physics Letters*, vol. 76, No. 21,(May 22, 2000),pp. 3043–3045.

Kim, Taeseok , et al., "Dielectric Properties and Strain Analysis in Paraelectric ZrTiO4 Thin Films", *Japan Journal of Applied Physics*, vol. 39,(2000),pp. 4153–4157.

Kim, Yongjo , et al., "Effect of microstructures on the micorwave dielectric properties of ZrTiO4 thin films", *Applied Physics Letters*, vol. 78, No. 16,(Apr. 16, 2001),pp. 2363–2365.

Kim, Y. , et al., "Substrate dependence on the optical properties of Al2O3 films grown by atomic layer deposition", *Appl. Phys. Lett. 71*, 25,(Dec. 22, 1997),pp. 3604–3606.

Kukli, Kaupo , et al., "Atomic Layer Deposition of Titanium Oxide Til4 and H2O2", *Chem. Vap. Deposition*, vol. 6, No. 6,(2000),pp. 303–310.

Kukli, Kaupo , et al., "Dielectric Properties of Zirconium Oxide Grown by Atomic Layer Deposition from Iodide Precursor", *Journal of The Electrochemical Society*, 148(12),(2001),pp. F227–F232.

Lee, A. E., et al., "Epitaxially grown sputtered LaAlO3 films", *Appl. Phys. Lett. 57 (19)*, (Nov. 5, 1990),pp. 2019–2021.

Lee, Cheng–Chung , et al., "Ion–assisted deposition of silver thin films", *Thin Solid Films*, 359,(2000),pp. 95–97.

Lee, Dong H., et al., "Metalorganic chemical vapor deposition of TiO2:N anatase thin film on Si substrate", *Appl. Phys. Lett.*, 66(7),(Feb. 13, 1995),pp. 815–816.

Lee, L. P., et al., "Monolithic 77 K dc SQUID magnetometer", *Appl. Phys. Lett. 59(23)*, (Dec. 2, 1991),pp. 3051–3053.

Lee, C. H., et al., "MOS Characteristics of Ultra Thin Rapid Thermal CVD ZrO2 and Zr Silicate Gate Dielectrics", *IEDM*, (2000),pp. 27–30.

Lee, C. H., et al., "MOS Devices with High Quality Ultra Thin CVD ZrO2 Gate Dielectrics and Self–Aligned TaN and TaN/Poly–Si Gate electrodes", *2001 Symposium on VLSI, Technology Digest of Technical Papers*, (2001),pp. 137–138.

Lee, Byoung H., et al., "Ultrathin Hafnium Oxide with Low Leakage and Excellent Reliability for Alternative Gate Dielectric Application", *Technical Digest of IEDM*, (1999), pp. 133–136.

Leskela, M. , et al., "ALD precursor chemistry: Evolution and future challenges", *J. Phys. IV France, 9*, (1999),pp. 837–852.

Luo, "Ultra–thin ZrO2 (or Silicate) with High Thermal Stability for CMOS GAte Applications", *2001 Symposium on VLSI Technology Digest of Technical Papers*, pp. 135–136.

Molodyk, A. A., et al., "Volatile Surfactant–Assisted MOCVD: Application to LaAl03 Thin Film Growth", *Chem. Vap. Deposition* vol. 6, No. 3, (2000),),pp. 133–138.

Muller, D. A., "The Electronic Structure at the Atomic Scale of Ultrathin Gate Oxides", *Nature*, 399, (Jun. 1999),758–761.

Nakagawara, Osamu , et al., "Electrical properties of (Zr, Sn)TiO4 dielectric thin film prepared by pulsed laser deposition", *J. Appl. Phys.*, 80(1),(Jul. 1, 1996),pp. 388–392.

Nakajima, Anri , et al., "Atomic–layer deposition of ZrO2 with a Si nitride barrier layer", *Applied Physics Letters*, vol. 81, No. 15,(Oct. 7, 2002),pp. 2824–2826.

Oates, D E., et al., "Surface Impedance Measurements of YBa2Cu3O7–x Thin Films in Stripline Resonators", *IEEE Transactions on Magnetics*, vol. 27, No. 2,(1991),pp. 867–871.

Osten, H. J., et al., "High–k Gate Dielectrics with Ultra–low Leakage Current Based on Praseodymium Oxide", *Technical Digest of IEDM*, (2000),pp. 653–656.

Park, Byung–Eun , et al., "Electrical properties of LaAlO3/Si and Sr0.8Bi2.2Ta2O9/LaAlO3/Si structures", *Applied Physics Letters*, vol. 79, No. 6,(Aug. 6, 2001),pp. 806–808.

Perkins, Charles M., et al., "Electrical and materials properties of ZrO2 gate dielectrics grown by atomic layer chemical vapor deposition", *Applied Physics Letters*, vol. 78, No. 16,(Apr. 16, 2001),pp. 2357–2359.

Qi, W, "MOSCAP and MOSFET characteristics using ZrO2 gate dielectric deposited directly on Si", *IEDM—Technical Digest*, (1999),pp. 145–148.

Qi, Wen–Jie , et al., "Performance of MOSFETs with ultra thin ZrO2 and Zr–silicate gate dielectrics", *IEEE*, (2000),pp. 40–41.

Qi, Wen–Jie , et al., "Performance of MOSFETs with ultra thin ZrO2 and Zr–silicate gate dielectrics", *2000 Symposium on VLSI Technology, Digest of Technical Papers*, pp. 40–41.

Ramakrishnan, E. S., et al., "Dielectric Properties of Radio Frequency Magnetron Sputter Deposited Zirconium Titanate–Based Thin Films", *J. Electrochem. Soc.*, vol. 145, No. 1,(Jan., 1998),pp. 358–362.

Ritala, Mikko , et al., "Zirconium dioxide thin films deposited by ALE using zirconium tetrachloride as precursor", *Applied Surface Science*, vol. 75,(1994),pp. 333–340.

Saito, Y. , "High–Integrity Silicon Oxide Grown at Low-temperature by Atomic Oxygen Generated in High–Density Krypton Plasma", *Extended Abstracts of the 1999 International Conference on Solid State Devices and Materials*, (1999),pp. 152–153.

Shin, Chang H., et al., "Fabriation and Characterization of MFISFET Using Al2O3 Insulating Layer for Non–volatile Memory", *12th International Symposium in Integrated Ferroelectrics*, (Mar., 2000),9 pages.

Sneh, Ofer , et al., "Thin film atomic layer deposition equipment for semiconductor processing", *Thin Solid Films*, 402,(2002),pp. 248–261.

Takemoto, J. H., et al., "Microstrip Resonators and Filters Using High–TC Superconductng Thin Films on LaAlO3", *IEEE Transaction on Magnetics*, vol. 27, No. 2, (Mar., 1991),pp. 2549–2552.

Tarre, A. , et al., "Comparative study of low–temperature chloride atomic–layer chemical vapor deposition of TiO2 and SnO2", *Applied Surface Science*, (2001),pp. 111–116.

Van Dover, R. B., et al., "Amorphous lanthanide–doped TiOx dielectric films", *Applied Physics Letters*, vol. 74, No. 20,(May 17, 1999),pp. 3041–3043.

Van Dover, Robert B., et al., "Deposition of Uniform Zr–Sn–Ti–O films by ON–Axis Reactive Sputtering", *IEEE Electron Device Letters*, vol. 19, No. 9,(Sep., 1998),pp. 329–331.

Van Dover, R. B., et al., "Discovery of a useful thin–film dielectric using a composition–spread approach", *Letters to Nature*, (1997),3 pages.

Wilk, G. D., "High–K gate dielectrics: Current status and materials properties considerations", *Journal of Applied Physics*, vol. 89, No. 10,(2001),pp. 5243–5275.

Wilk, G. D., et al., "High–K gate dielectrics: Current status and materials properties considerations",*J. Appl. Phys.*, vol. 89, No. 10, (May 15, 2001),pp. 5243–5275.

Wolf, Stanley , et al., "Silicon Processing for the VLSI Era—vol. I: Process Technology", *Second Edition, Lattice Press*, Sunset Beach, California,(2000),p. 443.

Yamaguchi, Takeshi , et al., "Band Diagram and Carrier Conduction Mechanism in ZrO2/Zr–silicate/Si MIS Structure Fabricated by Pulsed–laser–ablation Deposition", *IEDM*, (2000),pp 19–22.

Yamaguchi, Takeshi , et al.,"Study on Zr–Silicate Interfacial Layer of ZrO2–MIS Structure FAbricated by Pulsed Laser Ablation Deposition Method", *Solid State Devices and Materials*, (2000),pp. 228–229.

Zhang, H. , "Atomic Layer Deposition of High Dielectric Constant Nanolaminates", *Journal of The Electrochemical Society*, 148(4),(Apr., 2001),F63–F66.

Zhang, H. , et al., "High permittivity thin film nanolaminates", *Journal of Applied Physics*, vol. 87, No. 4,(Feb. 15, 2000), pp. 1921–1924.

Zhu, W. , et al., "HfO2 and HfAlO for CMOS: Thermal Stability and Current Tranport", *IEEE International Electron Device Meeting 2001*, (2001),pp. 463–466.

Aarik, Jaan , et al., "Influence of substrate temperature on atomic layer growth and properties of HfO/sub 2/ thin films", *Thin Solid Films*, 340(1–2), (1999), 110–116.

Alen, Petra, "Atomic Layer deposition of Ta(AI)N(C) thin films using trimethylaluminum as a reducing agent", *Journal of the Electrochemical Society*, 148(10), (Oct. 2001), G566–G571.

Bendoraitis, J G., et al., "Optical energy gaps in the monoclinic oxides of hafnium and zirconium and their solid solutions", *Journal of Physical Chemistry*, 69(10), (1965), 3666–3667.

Chambers, J J., et al., "Physical and electrical characterization of ultrathin yltrium silicate insulators on silicon", *Journal of Applied Physics*, 90(2), (Jul. 15, 2001),918–33.

Dusco, C , et al., "Deposition of tin oxide into porous silicon by atomic layer epitaxy", *Journal of the Electrochemical Society*, 143, (1996),683–687.

El–Kareh, B , et al., "The evolution of DRAM cell technology", *Solid State Technology*, 40(5), (1997),89–90, 92, 95–6, 98, 100–1.

Forsgren, K , *Comprehensive Summaries of Uppsala Dissertation from the Faculty of Science and Techonology*, 665, (2001),37.

Guillaumot, B , et al., "75 nm damascene metal gate and high–k integration for advanced CMOS devices", *Technical Digest of International Electron Devices Meeting 2002*, (2002),355–358.

Gutowski, M J., "Thermodynamic stability of High–K dielectric metal oxides ZrO/sub 2/ and HfO/sub 2/–in contact with Si and SiO/sub 2/", *Applied Physics Letters*, 80(11), (Mar. 18, 2002), 1897–1899.

Jung, H S., et al., "Improved current performance of CMOSFETs with nitrogen incorporated HfO/sub 2/–AI/sub 2/O/sub 3/ laminate gate dielectric", *Technical Digest of International Electron Devices Meeting 2002*, (2002),853–856.

Kang, L, et al., "MOSFET devices with polysilicon on single–layer HfO/sub 2/ high–K dielectrics", *International Electron Devices Meeting 2000. Technical Digest. IEDM*, (2000),35–8.

Kim, Y.W., et al., "50nm gate length logic technology with 9–layer Cu interconnects for 90nm node SoC applications", *Technical Digest of International Electron Devices Meeting 2002*, (2002),69–72.

Kukli, K , et al., "Comparison of hafnium oxide films grown by atomic layer deposition from Iodide and chloride precursors", *Thin Solid Films*, 416, (2002),72–79.

Kukli, Kaupo , et al., "Influence of thickness and growth temperature on the porperties of zirconium oxide films growth by atomic layer deposition on silicon", *Thin Solid Films*, 410(1–2), (2002),53–60.

Kukli, Kaupo, et al., "Low–Temperature Deposition of Zirconium Oxide–Based Nanocrystalline Films by Alternate Supply of Zr[OC(CH3)3]4 and H2O", *Chemical Vapor Deposition, 6(6),* (2000),297–302.

Kukli, K J., et al., "Properties of hafnium oxide films grown by atomic layer deposition from hafnium tetraiodide and oxygen", *Journal of Applied Physics,* 92(10), (Nov. 15, 2002),5598–5703.

Lee, Byoung H., et al., "Characteristics of TaN gate MOSFET with ultrathin hafnium oxide (8 A–12 A)", *Electron Devices Meeting, 2000. IEDM Technical Digest. International,* (2000),39–42.

Lee, S.J., et al., "High quality ultra thin CVD HfO2 gate stack with poly–Si gate electrode", *Electron Devicea Meeting, 2000. IEDM Technical Digest. International,* (2000), 31–34.

Lee, Jung–Hyoung, et al., "Mass production worthy HfO/sub 2/–Al/sub 2/O/sub 3/ laminate capacitor technology using Hf liquid precursor for sub–100 nm DRAMs", *Electron Devices Meetings. 2002. IEDM '02. Digest. International.* (2002),221–224.

Nakajima, Anri , "Soft breakdown free atomic–layer–deposited silicon–nitride/SiO/sub 2/ stack gate dielectrics", *International Electron Devices Meeting. Technical Digest,* (2001),6.5.1–4.

Nilisk, A , "Atomic–scale optical monitoring of the initial growth of TiO2 thin films", *Proceedings of the SPIE –The International Society for Optical Engineering,* 4318, (2001), 72–77.

Oh, C B., et al., "Manufacturable embedded CMOS 6T–SRAM technology with high–k gate dielectric device for system–on–chip applications", *Technical Digest of International Electron Devices Meeting 2002,* (2002),423–426.

Park, Jaehoo , et al., "Chemical vapor deposition of HfO/sub 2/ thin films using a novel carbon–free precursor: characterization of the interface with the silicon substrate", *Journal of the Electrochemical Society,* 149(1), (2002),G89–G94.

Poveshchenko, V P., et al., "Investigation of the phas composition of films of zirconium, hafnium and yttrium oxides", *Soviet Journal of Optical Technology,* 51(5), (1984),277–279.

Rahtu, Antti, et al., "Atomic Layer Deposition of Zirconium Titanium Oxide from Titanium Isopropoxide and Zirconium Chloride", *Chemistry of Materials,* 13(5), (May 2001), 1528–1532.

Robertson, J., "Band offsets of wide–band–gap oxides and implications for Future electronic devices", *Journal of Vacuum Science & Technology B (Microelectronics and Nanometer Structures),* 18(3), (May–Jun. 2000), 1785–1791.

Rossnagel, S M., et al., "Plasma–enhanced atomic layer deposition of Ta and Ti for interconnect diffusion barriers", *Journal of Vacuum Science & Technology B (Microelectronics and Nanometer Structures),* 18(4), (Jul. 2000),2016–2020.

Tavel, B , et al., "High performance 40 nm nMOSFETs with HfO/sub 2/ gate dielectric and polysilicon damascene gate", *Technical Digest of International Electron Devices Meetings 2002,* (2002),429–432.

Van Dover, R B., et al., "Deposition of Uniform Zr–Sn–Ti–O Films by On–Axis Reactive Sputtering", *IEEE Electron Device Letters,* 19(9), (Sep. 1998),329–331.

Wolf, S., et al., *In: Silicon Processing of the VLSI Era, vol. 1,* Lattice Press,374–380.

Wolfram, G , et al., "Existence range, Structural and dielectric properties of ZrxTiySnzO4 ceramics (x +y =2)", *Materials Research Bulletin,* 16(11), (Nov 1981), 1455–63.

\* cited by examiner

LOW-TEMPERATURE GROWN HIGH QUALITY ULTRA-THIN COTIO3 GATE DIELECTRICS

FIELD OF THE INVENTION

The invention relates to semiconductor devices and device fabrication. Specifically, the invention relates to gate oxide layers of transistor devices and their method of fabrication.

BACKGROUND OF THE INVENTION

In the semiconductor device industry, particularly in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Figure 1:
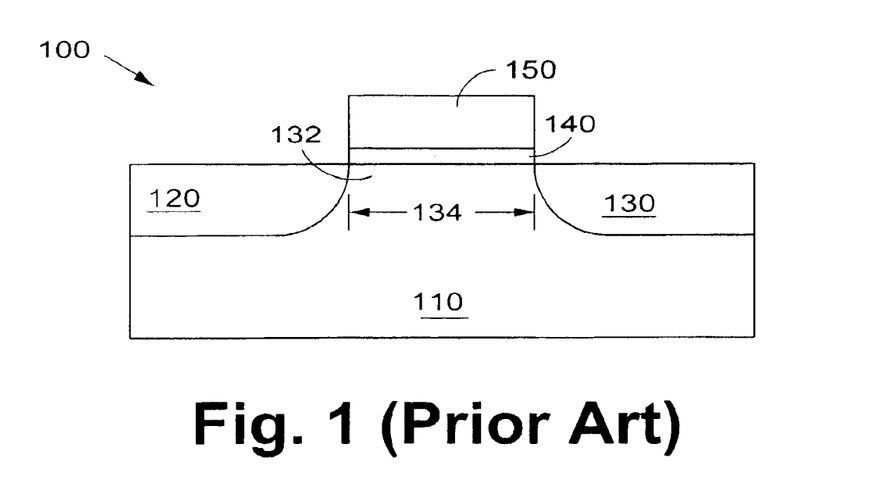
FIG. 1 shows a common configuration of a transistor.

A common configuration of a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, the body region 132 defining a channel of the transistor with a channel length 134. A gate dielectric, or gate oxide 140 is located on the body region 132 with a gate 150 located over the gate oxide. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate oxide 140. A gate oxide 140, when operating in a transistor, has both a physical gate oxide thickness and an equivalent oxide thickness (EOT). The equivalent oxide thickness quantifies the electrical properties, such as capacitance, of a gate oxide 140 in terms of a representative physical thickness. EOT is defined as the thickness of a theoretical $SiO_2$ layer that describes the actual electrical operating characteristics of the gate oxide 140 in the transistor 100. For example, in traditional $SiO_2$ gate oxides, a physical oxide thickness may be 5.0 nm, but due to undesirable electrical effects such as gate depletion, the EOT may be 6.0 nm. A gate oxide other than $SiO_2$ may also be described electrically in terms of an EOT. In this case, the theoretical oxide referred to in the EOT number is an equivalent $SiO_2$ oxide layer. For example, $SiO_2$ has a dielectric constant of approximately 4. An alternate oxide with a dielectric constant of 20 and a physical thickness of 100 nm would have an EOT of approximately 20 nm=(100*(4/20)), which represents a theoretical $SiO_2$ gate oxide.

Lower transistor operating voltages and smaller transistors require thinner equivalent oxide thicknesses (EOTs). A problem with the increasing pressure of smaller transistors and lower operating voltages is that gate oxides fabricated from $SiO_2$ are at their limit with regards to physical thickness and EOT. Attempts to fabricate $SiO_2$ gate oxides thinner than today's physical thicknesses show that these gate oxides no longer have acceptable electrical properties. As a result, the EOT of a $SiO_2$ gate oxide 140 can no longer be reduced by merely reducing the physical gate oxide thickness.

Attempts to solve this problem have led to interest in gate oxides made from oxide materials other than $SiO_2$. Certain alternate oxides have a higher dielectric constant (k), which allows the physical thickness of a gate oxide 140 to be the same as existing $SiO_2$ limits or thicker, but provides an EOT that is thinner than current $SiO_2$ limits.

A problem that arises in forming an alternate oxide layer on the body region of a transistor is the process in which the alternate oxide is formed on the body region. Recent studies show that the surface roughness of the body region has a large effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness. In forming an alternate oxide layer on the body region of a transistor, a thin layer of the alternate material to be oxidized (typically a metal) must first be deposited on the body region. Current processes for depositing a metal or other alternate layer on the body region of a transistor are unacceptable due to their effect on the surface roughness of the body region.

Figure 2A:
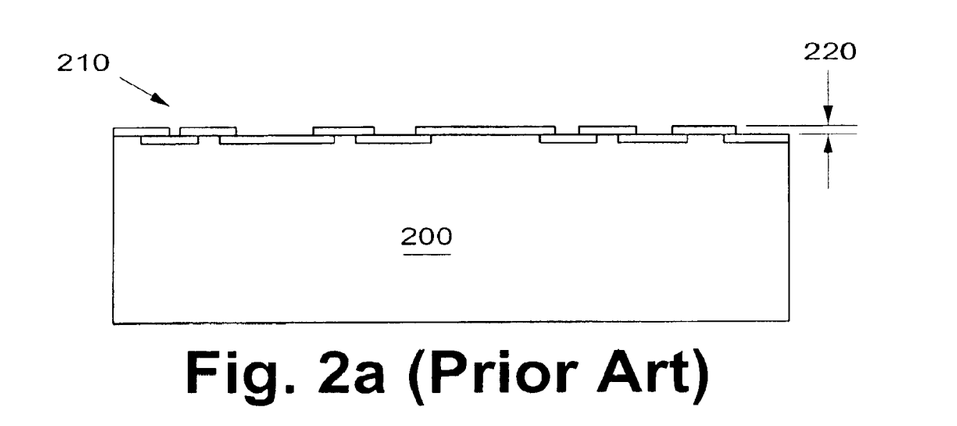
FIG. 2A shows a smooth surface of a body region of a transistor.
Figure 2B:
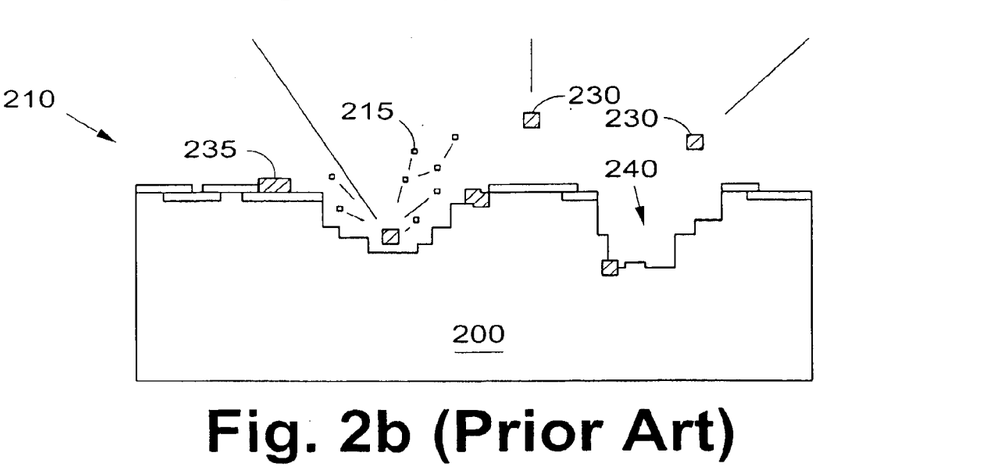
FIG. 2B shows a deposition process according to the prior art.
Figure 2C:
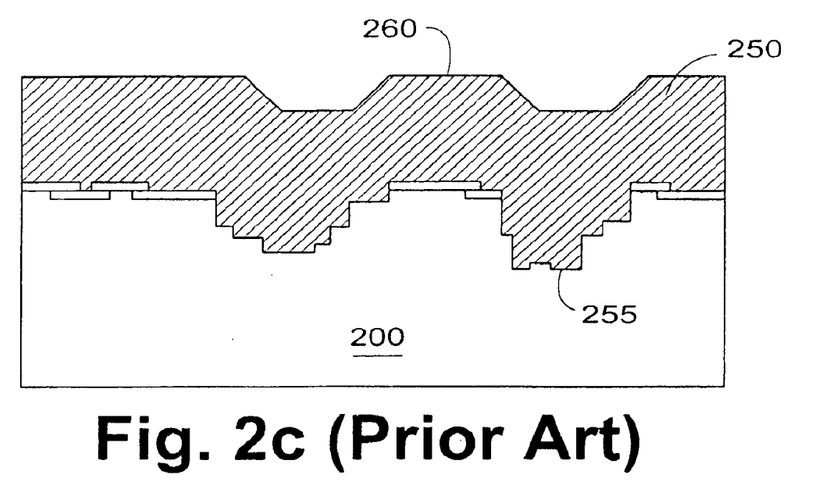
FIG. 2C shows a deposited film on a body region according to the prior art.

FIG. 2A shows a surface 210 of a body region 200 of a transistor. The surface 210 in the Figure has a high degree of smoothness, with a surface variation 220. FIG. 2B shows the body region 200 during a conventional sputtering deposition process stage. During sputtering, particles 230 of the material to be deposited bombard the surface 210 at a high energy. When a particle 230 hits the surface 210, some particles adhere as shown by particle 235, and other particles cause damage as shown by pit 240. High energy impacts can throw off body region particles 215 to create the pits 240. A resulting layer 250 as deposited by sputtering is shown in FIG. 2C. The deposited layer/body region interface 255 is shown following a rough contour created by the sputtering damage. The surface of the deposited layer 260 also shows a rough contour due to the rough interface 255.

In a typical process of forming an alternate material gate oxide, the deposited layer 250 is oxidized to convert the layer 250 to an oxide material. Existing oxidation processes do not, however, repair the surface damage created by existing deposition methods such as sputtering. As described above, surface roughness has a large influence on the electrical properties of the gate oxide and the resulting transistor.

What is needed is an alternate material gate oxide that is more reliable at existing EOTs than current gate oxides. What is also needed is an alternate material gate oxide with an EOT thinner than conventional $SiO_2$. What is also needed is an alternative material gate oxide with a smooth interface between the gate oxide and the body region. Because existing methods of deposition are not capable of providing a smooth interface with an alternate material gate oxide, what is further needed is a method of forming an alternate material gate oxide that maintains a smooth interface.

Additionally, at higher process temperatures, any of several materials used to fabricate the transistor, such as silicon, can react with other materials such as metals or oxygen to form unwanted silicides or oxides. At high process temperatures, materials such as dopants can also migrate to unwanted areas, changing the desired structure or composition profile that is desired. What is needed is a lower temperature process of forming gate oxides that prevents migration and the formation of unwanted byproduct materials.

SUMMARY OF THE INVENTION

A method of forming a gate oxide on a surface such as a transistor body region is shown where a metal alloy layer is deposited by thermal evaporation on the body region. The metal alloy layer is then oxidized to convert the metal alloy layer to a gate oxide. In one embodiment, the metal alloy layer includes cobalt (Co) and titanium (Ti). One embodiment of the invention uses an electron beam source to evaporate the metal alloy layer onto the body region of the transistor. The oxidation process in one embodiment utilizes a krypton (Kr)/oxygen ($O_2$) mixed plasma process.

In addition to the novel process of forming a gate oxide layer, a transistor formed by the novel process exhibits novel features that may only be formed by the novel process. Thermal evaporation deposition of a metal alloy layer onto a body region of a transistor preserves an original smooth surface roughness of the body region in contrast to other prior deposition methods that increase surface roughness. The resulting transistor fabricated with the process of this invention will exhibit a gate oxide/body region interface with a surface roughness variation as low as 0.6 nm.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 3A:
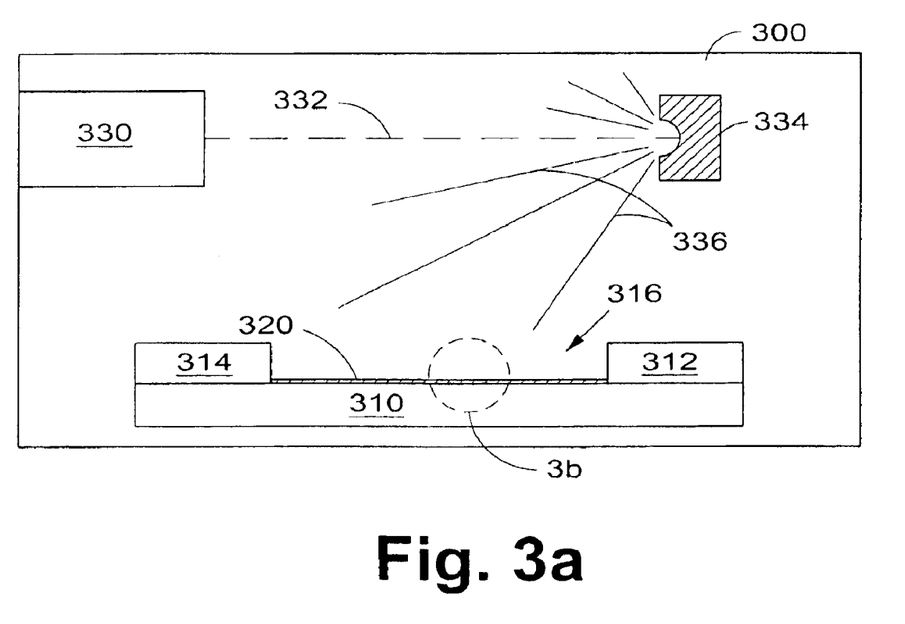
FIG. 3A shows a deposition process according to the invention.

FIG. 3A shows an electron beam evaporation technique to deposit a material on a surface such as a body region of a transistor. In FIG. 3A, a substrate 310 is placed inside a deposition chamber 300. The substrate in this embodiment is masked by a first masking structure 312 and a second masking structure 314. In this embodiment, the unmasked region 316 includes a body region of a transistor, however one skilled in the art will recognize that other semiconductor device structures may utilize this process. Also located within the deposition chamber 300 is an electron beam source 330, and a target 334. In one embodiment, a single electron beam source is used and a single target is used. However multiple targets and electron beam sources could be used. In one embodiment, a single target is used that includes an alloy material of two elements. In alternative embodiments, more than two elements are included in an alloy target. Although in this embodiment, an electron beam evaporation technique is used, it will be apparent to one skilled in the art that other thermal evaporation techniques can be used without departing from the scope of the invention.

During the evaporation process, the electron beam source 330 generates an electron beam 332. The electron beam hits the target 334 and heats a portion of the target enough to cause the surface of the target to evaporate. The evaporated material 336 is then distributed throughout the chamber 300, and the material 336 deposits on surfaces that it contacts, such as the exposed body region 316. The depositing material builds up to form a layer 320 of material that is chemically the same as the target 334.

In one embodiment, the evaporation process is performed at a background pressure of approximately $1\times10^{-7}$ torr. In one embodiment the target is preheated for several minutes before the evaporation process begins. One typical evaporation rate for this process includes a rate of 0.5 to 1.0 nm/second. A device such as a quartz crystal microbalance is used to assist monitoring of the deposition process in one embodiment. Using a metal evaporation process as described above, a packing density of the layer 320 approaches 1.0. In other words, the layers 320 generated by this process will have close to zero lattice defects.

In one embodiment of the invention, the deposited material layer 320 includes a multiple metal alloy layer. In one embodiment of the invention, the deposited material layer 320 includes cobalt (Co) and titanium (Ti). In one embodiment of the invention, the target is a single target of cobalt and titanium alloy. In one embodiment, two targets containing one element each are used to form the layer 320. One advantage of the thermal evaporation process is the high purity targets that are available for the process. Zone refined targets have purity as high as 99.9999%. Additionally, the evaporation process itself further purifies the target materials thus increasing the final purity of the layer 320 beyond even the target purity. The more violent nature of other deposition methods tends to mix impurities into the deposited layer during deposition. Therefore a uniquely pure layer 320 and further, a uniquely pure layer oxide is possible using this novel method.

The choice of materials for oxidation is based on the properties of the oxide formed. Considerations included the thermodynamic stability of the oxide with silicon, the diffusion coefficient of the oxide at high processing temperatures such as 1000° K., the lattice match of the oxide with silicon, the dielectric constant of the oxide, and the conduction band offset of the oxide. In one embodiment, the dielectric constant is approximately 40, which is approximately ten times he dielectric constant of $SiO_2$. In one embodiment, the deposited material layer 320 is substantially amorphous. A lower presence of grain boundaries in the substantially amorphous material layer 320 reduces the leakage current through the final gate oxide. Although the amorphous form is preferred, the materials chosen for oxidation, such as cobalt and titanium are also acceptable in crystalline form.

A thermal evaporation process such as the electron beam evaporation technique described above does not cause the surface damage that is inherent in other deposition techniques such as the sputtering technique shown in FIG. 2B. This allows a very thin layer of material to be deposited on a body region of a transistor, while maintaining a smooth interface. A thermal evaporation process such as the electron beam evaporation technique described above also allows low processing temperatures that inhibit the formation of unwanted byproducts such as silicides and oxides. In one embodiment, the thermal evaporation is performed with a substrate temperature between approximately 100 and 150° C.

Figure 3B:
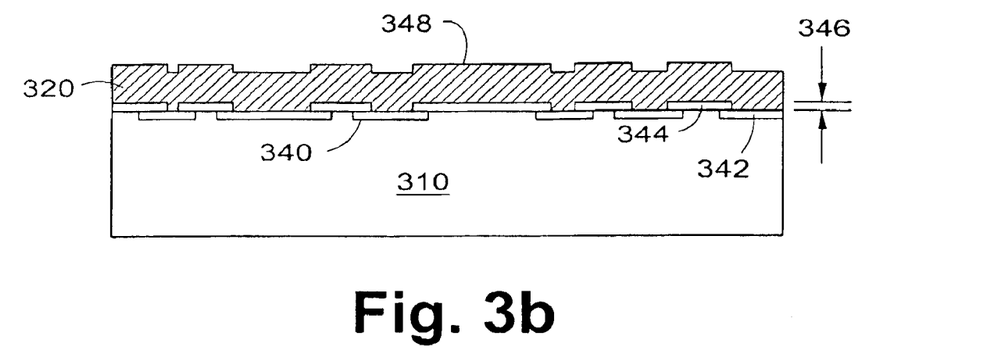
FIG. 3B shows a magnified view of a deposited film on a body region from FIG. 3A.

FIG. 3B shows a magnified view of the body region 316 and the deposited layer 320 from FIG. 3A. The interface 340 is shown with a roughness variation 346. The surface of the deposited layer 348 is also shown with a similar surface roughness. One possible surface variation 346 would be an atomic layer variation. In atomic smoothness, the greatest difference in surface features is between a first atomic layer as indicated by layer 342 and a second atomic layer 344. The thermal evaporation deposition technique described above preserves atomic smoothness such as is shown in FIG. 3B, however other acceptable levels of surface roughness greater than atomic smoothness will also be preserved by the thermal evaporation technique.

Figure 4A:
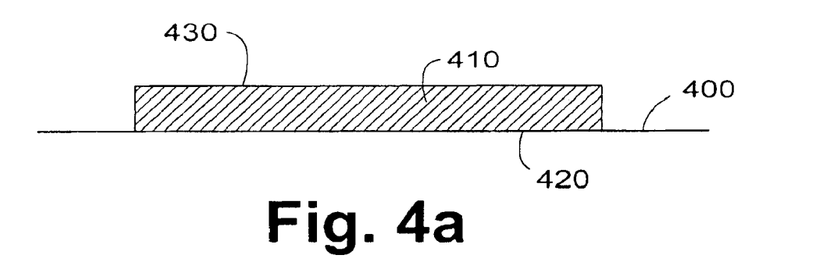
FIG. 4A shows a deposited film on a body region according to the invention.
Figure 4B:
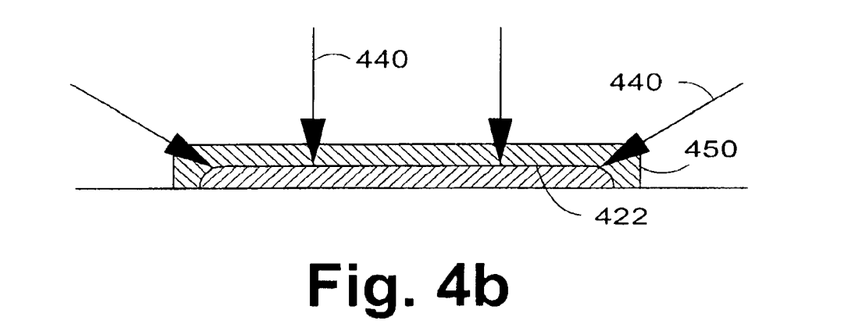
FIG. 4B shows a partially oxidized film on a body region according to the invention.
Figure 4C:
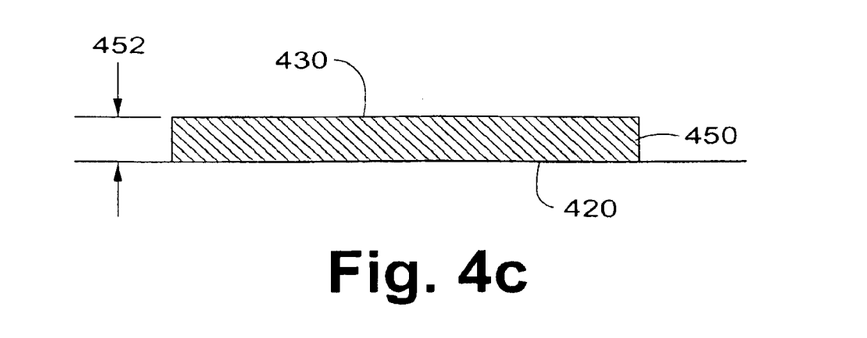
FIG. 4C shows a completely oxidized film on a body region according to the invention.

FIGS. 4A–4C show a low temperature oxidation process that is used in one embodiment to convert the deposited layer 320 into a gate oxide. A deposited material layer 410 is shown in FIG. 4A on a substrate surface 400. The layer 410 forms an interface 420 with the substrate surface 400, and the layer 410 has an outer surface 430. The layer 410 in this embodiment is deposited over a body region of a transistor, however the layer may be deposited on any surface within the scope of the invention.

In FIG. 4B, the layer 410 is in the process of being oxidized. In one embodiment, the oxidation process includes a krypton/oxygen mixed plasma oxidation process. The mixed plasma process generates atomic oxygen or oxygen radicals in contrast to molecular oxygen or $O_2$ used in conventional thermal oxidation. The atomic oxygen in this embodiment is generated by microwave excitation of the krypton and oxygen environment to form a high-density plasma. The atomic oxygen is introduced to the layer from all exposed directions as indicated by arrows 440, creating an oxide portion 450. The atomic oxygen continues to react with the layer and creates an oxidation interface 422. As the reaction progresses, atomic oxygen diffuses through the oxide portion 450 and reacts at the oxidation interface 422 until the layer is completely converted to an oxide of the deposited material layer. FIG. 4C shows the resulting oxide layer 450 which spans a physical thickness 452 from the outer surface 430 to the interface 420.

In one embodiment, the processing variables for the mixed plasma oxidation include a low ion bombardment energy of less than 7 eV, a high plasma density above $10^{12}/cm^3$ and a low electron temperature below 1.3 eV. In one embodiment, the substrate temperature is approximately 400° C. In one embodiment, a mixed gas of 3% oxygen with the balance being krypton at a pressure of 1 Torr is used. In one embodiment, a microwave power density of 5 W/cm² is used. In one embodiment, the oxidation process provides a growth rate of 2 nm/min.

The low substrate temperature of the mixed plasma oxidation process described above allows the deposited layer to be oxidized at a low temperature, which inhibits the formation of unwanted byproducts such as silicides and oxides. The low temperature also inhibits migration of elements such as dopant species. Low migration preserves designed atomic distribution profiles, thus allowing more advanced device designs and providing higher reliability in existing device designs. The mixed plasma process in one embodiment is performed at approximately 400° C. in contrast to prior thermal oxidation processes that are performed at approximately 1000° C. The mixed plasma oxidation process has also been shown to provide improved thickness variation on silicon (111) surfaces in addition to (100) surfaces. Although the low temperature mixed plasma process above describes the formation of alternate material oxides, one skilled in the art will recognize that the process can also be used to form $SiO_2$ oxide structures.

In one embodiment, a cobalt-titanium alloy forms an oxide comprised of $CoTiO_3$. The cobalt-titanium oxide $CoTiO_3$ exhibits a dielectric constant of approximately 40, which allows for a thinner EOT than conventional $SiO_2$. In addition to the stable thermodynamic properties inherent in the oxides chosen, the novel process used to form the oxide layer is performed at lower temperatures than the prior art. This inhibits reactions with the silicon substrate or other structures, and inhibits unwanted migration of elements such as dopants.

A transistor made using the novel gate oxide process described above will possess several novel features. By creating an oxide material with a higher dielectric constant (k) and controlling surface roughness during formation, a gate oxide can be formed with an EOT thinner than 2 nm. A thicker gate oxide that is more uniform, and easier to process can also be formed with the alternate material oxide of the present invention, the alternate material gate oxide possessing an EOT equivalent to the current limits of $SiO_2$ gate oxides. The smooth surface of the body region is preserved during processing, and a resulting transistor will have a smooth interface between the body region and the gate oxide with a surface roughness on the order of 0.6 nm.

Figure 5:
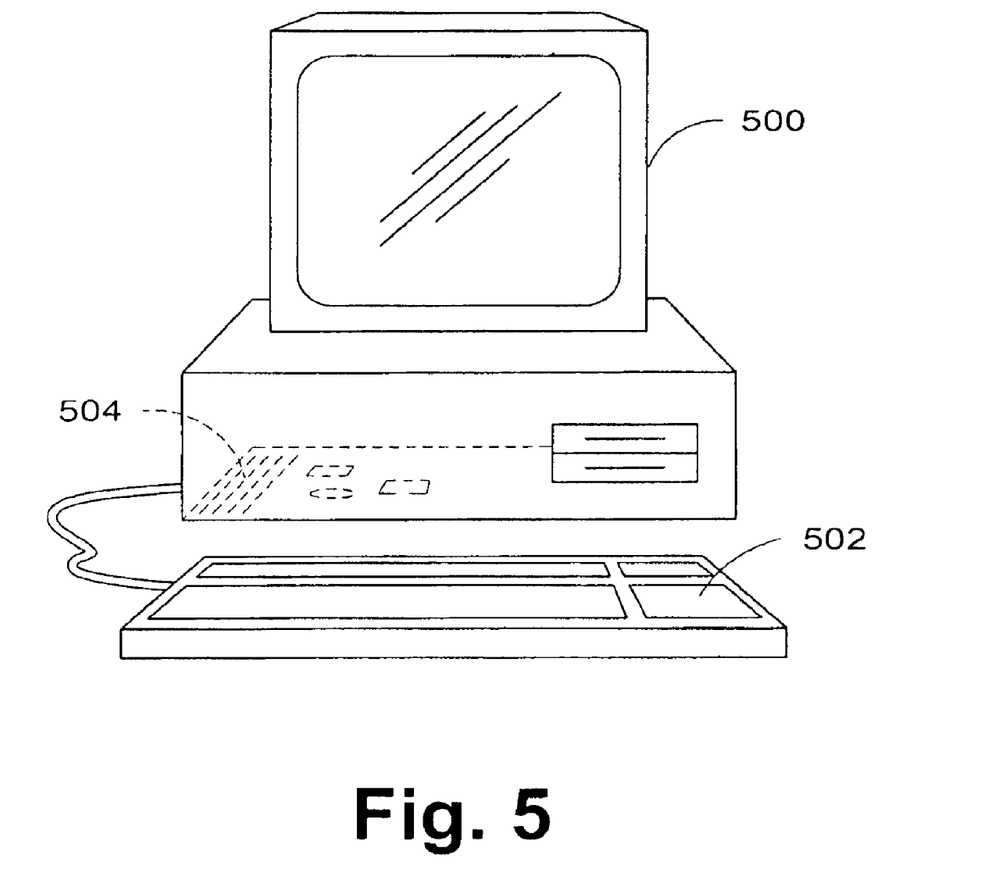
FIG. 5 shows a perspective view of a personal computer.
Figure 6:
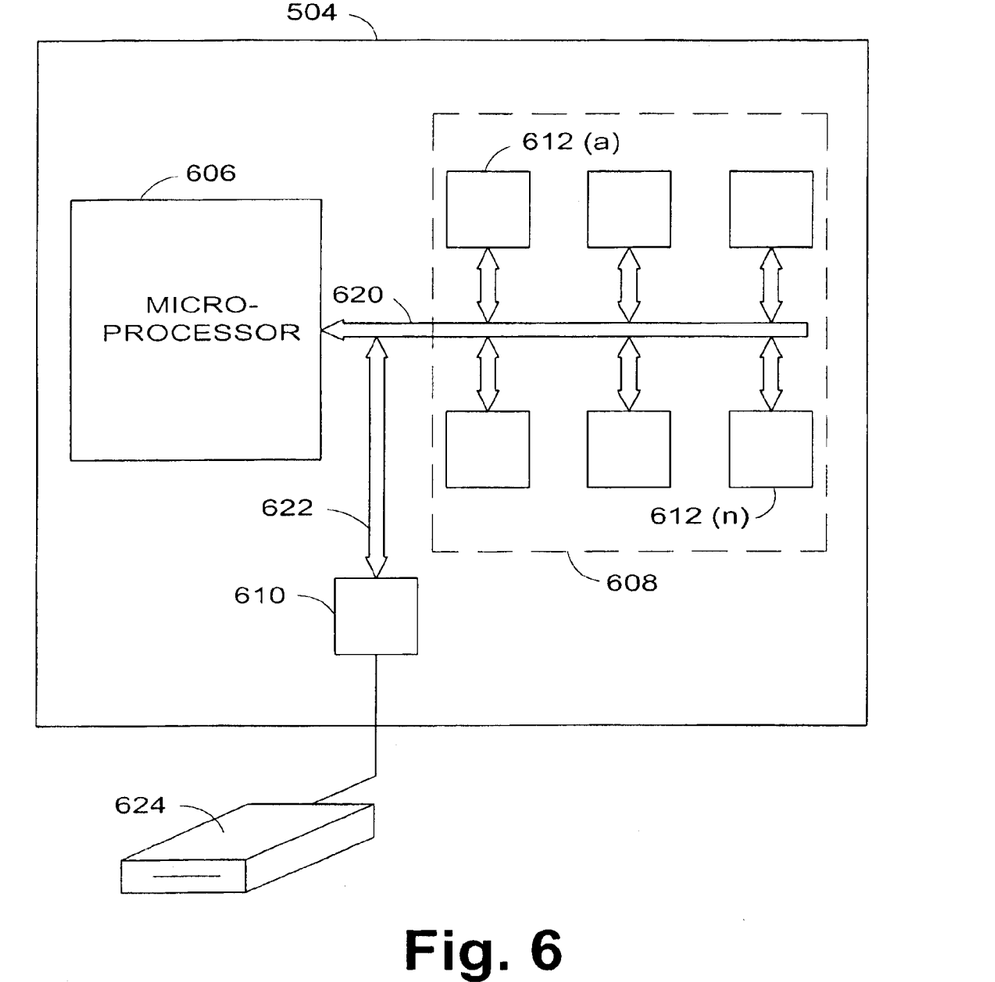
FIG. 6 shows a schematic view of a central processing unit.
Figure 7:
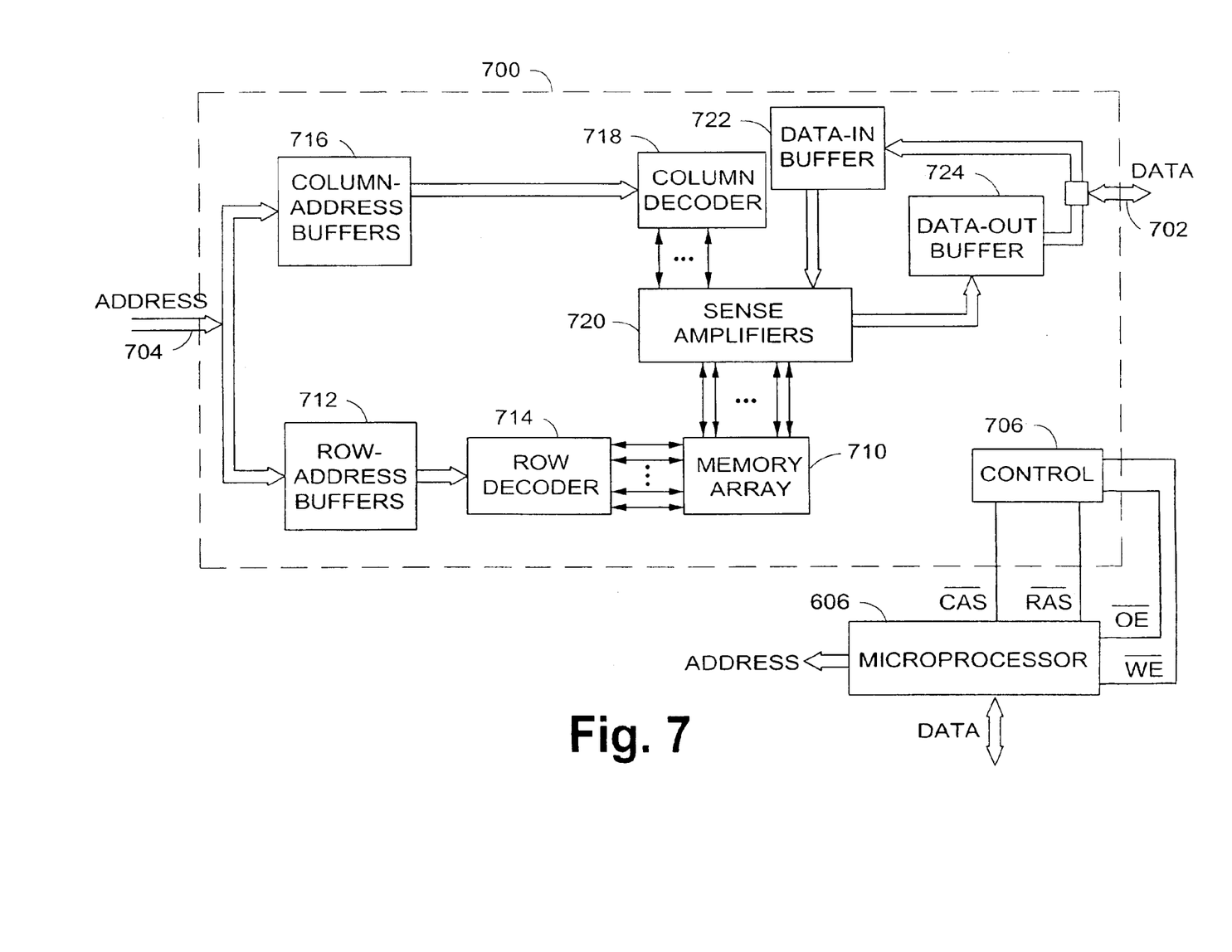
FIG. 7 shows a schematic view of a DRAM memory device.

Transistors created by the methods described above may be implemented into memory devices and information handling devices as shown in FIG. 5, FIG. 6, and FIG. 7 and as described below. While specific types of memory devices and computing devices are shown below, it will be recognized by one skilled in the art that several types of memory devices and information handling devices could utilize the invention.

A personal computer, as shown in FIGS. 5 and 6, include a monitor 500, keyboard input 502 and a central processing unit 504. The processor unit typically includes microprocessor 606, memory bus circuit 608 having a plurality of memory slots 612(a–n), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(a–n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(a–n). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Conclusion

Thus has been shown a gate oxide and method of fabricating a gate oxide that produce a more reliable and thinner equivalent oxide thickness. Gate oxides formed cobalt-titanium alloy are thermodynamically stable such that the gate oxides formed will have minimal reactions with a silicon substrate or other structures during any later high temperature processing stages. $CoTiO_3$ in particular has been shown to provide excellent electrical and thermodynamic properties. In addition to the stable thermodynamic properties inherent in the gate oxide of the invention, the process shown is performed at lower temperatures than the prior art. This inhibits reactions with the silicon substrate or other structures, and inhibits unwanted migration of elements such as dopants.

Transistors and higher level ICs or devices have been shown utilizing the novel gate oxide and process of formation. The higher dielectric constant (k) oxide materials shown in one embodiment are formed with an EOT thinner than 2 nm, e.g. thinner than possible with conventional $SiO_2$ gate oxides. A thicker gate oxide that is more uniform, and easier to process has also been shown with at EOT equivalent to the current limits of $SiO_2$ gate oxides.

A novel process of forming a gate oxide has been shown where the surface smoothness of the body region is preserved during processing, and the resulting transistor has a smooth interface between the body region and the gate oxide with a surface roughness on the order of 0.6 nm. This solves the prior art problem of poor electrical properties such as high leakage current, created by unacceptable surface roughness.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a gate oxide on a transistor body region, comprising:
    evaporation depositing a metal alloy layer on the body region wherein at least a portion of the alloy layer is amorphous; and
    oxidizing the metal alloy layer to form a metal oxide layer on the body region.

2. The method of claim 1, wherein evaporation depositing the metal alloy layer includes evaporation depositing cobalt and titanium.

3. The method of claim 1, wherein evaporation depositing the metal alloy layer includes evaporation depositing by electron beam evaporation.

4. The method of claim 3, wherein electron beam evaporation depositing the metal alloy layer includes electron beam evaporation of a single metal alloy target.

5. The method of claim 1, wherein evaporation depositing the metal alloy layer includes evaporation depositing at an approximate substrate temperature range of 100–150° C.

6. The method of claim 1, wherein oxidizing the metal alloy layer includes oxidizing at a temperature of approximately 400° C.

7. The method of claim 1, wherein oxidizing the metal alloy layer includes oxidizing with atomic oxygen.

8. The method of claim 1, wherein oxidizing the metal alloy layer includes oxidizing using a krypton (Kr)/oxygen ($O_2$) mixed plasma process.

9. A method of forming a gate oxide on a transistor body region, comprising:
    evaporation depositing a metal alloy layer on the body region wherein at least a portion of the alloy layer is amorphous; and
    oxidizing the metal alloy layer using a krypton (Kr)/oxygen ($O_2$) mixed plasma process to form a metal oxide layer on the body region.

10. The method of claim 9, wherein evaporation depositing the metal alloy layer includes evaporation depositing cobalt and titanium.

11. The method of claim 9, wherein evaporation depositing the metal alloy layer includes evaporation depositing by electron beam evaporation.

12. The method of claim 11, wherein electron beam evaporation depositing the metal alloy layer includes electron beam evaporation of a single metal alloy target.

13. The method of claim 9, wherein evaporation depositing the metal alloy layer includes evaporation depositing at an approximate substrate temperature range of 150–400° C.

14. A method of forming a gate oxide on a transistor body region, comprising:
    electron beam evaporation depositing a metal alloy layer on the body region wherein at least a portion of the alloy layer is amorphous; and
    oxidizing the metal alloy layer to form a metal oxide layer on the body region.

15. A method of forming a gate oxide on a transistor body region, comprising:
    evaporation depositing an alloy layer including cobalt and titanium on the body region, wherein substantially all of the alloy layer is amorphous; and
    oxidizing the metal alloy layer to form a metal oxide layer on the body region.

16. The method of claim 15, wherein oxidizing the metal alloy layer includes oxidizing with atomic oxygen.

17. The method of claim 15, wherein oxidizing the metal alloy layer includes oxidizing using a krypton (Kr)/oxygen ($O_2$) mixed plasma process.

18. A method of forming a gate oxide on a transistor body region, comprising;
    evaporation depositing an alloy layer including cobalt and titanium on the body region, wherein at least a portion of the alloy layer is amorphous; and oxidizing the metal alloy layer using a krypton (Kr)/oxygen (O$_2$) mixed plasma process to form a metal oxide layer on the body region.

19. The method of claim 18, wherein evaporation depositing the metal alloy layer includes evaporation depositing by electron beam evaporation.

20. The method of claim 18, wherein electron beam evaporation depositing the metal alloy layer includes electron beam evaporation of a single metal alloy target.

21. A method of forming a gate oxide on a transistor body region, comprising:

evaporation depositing an alloy layer including cobalt and titanium on the body region wherein at least a portion of the alloy layer is amorphous; and oxidizing the metal alloy layer to form a metal oxide layer on the body region.

22. The method of claim 21, wherein evaporation depositing the metal alloy layer includes evaporation depositing by electron beam evaporation.

23. The method of claim 21, wherein electron beam evaporation depositing the metal alloy layer includes electron beam evaporation of a single metal alloy target.

24. A method of forming a gate oxide on a transistor body region, comprising:

evaporation depositing an alloy layer including cobalt and titanium on the body region wherein at least a portion of the alloy layer is amorphous; and oxidizing the metal alloy layer using a krypton (Kr)/oxygen (O$_2$) mixed plasma process to form a metal oxide layer on the body region.

25. The method of claim 24, wherein oxidizing the metal alloy layer includes oxidizing with atomic oxygen.

26. The method of claim 24, wherein oxidizing the metal alloy layer includes oxidizing using a krypton (Kr)/oxygen (O$_2$) mixed plasma process.

* * * * *

UNITED STATES PATENT AND TRADEMARK OFFICE
CERTIFICATE OF CORRECTION

PATENT NO. : 6,953,730 B2
DATED : October 11, 2005
INVENTOR(S) : Ahn et al.

It is certified that error appears in the above-identified patent and that said Letters Patent is hereby corrected as shown below:

<u>Title page,</u>
Item 56, References Cited, U.S. PATENT DOCUMENTS, delete
"Forbes et al." and insert -- Ahn at al. --; delete "428/765" and insert -- 428/698 --.
OTHER PUBLICATIONS,
"Shin, Chang. H. et al." reference, delete "Fabriation" and insert -- Fabrication --.
"Aarik, Jaan, et al.," reference, delete "doposition" and insert -- deposition -- .
"De Flaviis, Franco, et al.," reference, delete "Micorwave" and insert -- Microwave --.
"Kim, Yongjo, et al.," reference, delete "micorwave" and insert -- microwave --.
"Molodyk, A.A., et al.," reference, after "(2000)," delete "),".
"Shin, Chang H., et al.," reference, delete "Fabriation" and insert -- Fabrication --.
"Takemoto, J.H., et al.," reference, delete "Superconductng" and insert
-- Superconducting --.
"Yamaguchi, Takeshi, et al.," reference, delete "Fabricated" and insert
-- Fabricated --.
"Zhu, W., et al.," reference, delete "Tranport" and insert -- Transport --.
"Chambers, J J., et al.," reference, delete "yltrium" and insert -- yttrium --.
"Kukli, K, et al.," reference, delete "porperties" and insert -- properties --.
"Kukli, K, et al.," (second occurrence), reference, delete "5598" and insert
-- 5698 --.
"Lee, S.J., et al.," reference, delete "Devicea" and insert -- Devices --.
"Lee, Jung-Hyoung, et al.," reference, delete "Meetings." and insert -- Meeting, --.
"Poveshchenko, V P., et al.," reference, delete "phas" and insert -- phase --.

<u>Column 10,</u>
Line 64, after "comprising" delete ";" and insert -- : --.

Signed and Sealed this

Twenty-first Day of March, 2006

JON W. DUDAS
*Director of the United States Patent and Trademark Office*